(12) United States Patent
Park et al.

(10) Patent No.: US 10,318,182 B2
(45) Date of Patent: Jun. 11, 2019

(54) SEMICONDUCTOR MEMORY APPARATUS RELATING TO VARIOUS OPERATION MODES, AND MEMORY MODULE AND SYSTEM INCLUDING THE SAME

(71) Applicant: SK hynix Inc., Icheon-si Gyeonggi-do (KR)

(72) Inventors: Hyun Jung Park, Icheon-si (KR); Kyung Hoon Kim, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/885,452

(22) Filed: Jan. 31, 2018

(65) Prior Publication Data

US 2018/0364925 A1    Dec. 20, 2018

(30) Foreign Application Priority Data

Jun. 20, 2017 (KR) ........................ 10-2017-0077692

(51) Int. Cl.
*G11C 7/22* (2006.01)
*G06F 3/06* (2006.01)

(52) U.S. Cl.
CPC .......... *G06F 3/0617* (2013.01); *G06F 3/0607* (2013.01); *G06F 3/0634* (2013.01); *G06F 3/0659* (2013.01)

(58) Field of Classification Search
CPC .... G06F 3/0617; G06F 3/0607; G06F 3/0634; G06F 3/0659
See application file for complete search history.

(56) References Cited

U.S. PATENT DOCUMENTS

| 8,582,339 | B2 | 11/2013 | Rajan |
| 9,223,655 | B2* | 12/2015 | Sugimoto ........... G06F 11/1096 |
| 9,319,067 | B2* | 4/2016 | Uchiyama ............. H03M 13/09 |
| 9,658,955 | B2* | 5/2017 | Park ..................... G06F 12/0238 |
| 2008/0256289 | A1* | 10/2008 | Lee ....................... G06F 3/0605 |
| | | | 711/103 |

FOREIGN PATENT DOCUMENTS

KR    1020060133892 A    12/2006

\* cited by examiner

*Primary Examiner* — Pho M Luu
(74) *Attorney, Agent, or Firm* — William Park & Associates Ltd.

(57) ABSTRACT

A semiconductor memory apparatus may include a first memory apparatus and a second memory apparatus, and may perform various operation modes. The first and second memory apparatuses may independently perform a write operation and a read operation in a first operation mode. The first memory apparatus may perform a write operation and a read operation and the second memory apparatus may perform a write operation in a second operation mode. The second memory apparatus may perform a write operation and a read operation in a third operation mode.

29 Claims, 5 Drawing Sheets

SEMICONDUCTOR MEMORY APPARATUS RELATING TO VARIOUS OPERATION MODES, AND MEMORY MODULE AND SYSTEM INCLUDING THE SAME

CROSS-REFERENCES TO RELATED APPLICATION

The present application claims priority under 35 U.S.C. § 119(a) to Korean application number 10-2017-0077692, filed on Jun. 20, 2017, in the Korean Intellectual Property Office, which is incorporated herein by reference in its entirety.

BACKGROUND

1. Technical Field

Various embodiments generally relate to a semiconductor technology, and, more particularly, to a semiconductor memory apparatus, a memory module, and a system.

2. Related Art

A general computer system may include a processor and a memory. The processor and the memory may be mounted onto a main board including signal transmission lines, and may perform data communication. A plurality of memory apparatuses may be configured in a module type and be mounted onto the main board. When the memory is used in a system such as a server, the memory may employ a mirror mode to improve the reliability of the server. In the server, since a system should be stably managed, operation reliability is regarded as a substantially important factor. The mirror mode is one of the necessary operations needed for securing reliability as one of RAS (reliability, availability and serviceability) features for improving the reliability of the server. In general, in order to perform the mirror mode, since an additional channel or an additional interface chip should be used between the processor and the memory, costs for configuring the system are inevitably increased. Also, a limitation exists in that, when the mirror mode is performed, another operation mode among the RAS features cannot be simultaneously performed.

SUMMARY

In an embodiment, a semiconductor memory apparatus may be provided. The semiconductor memory apparatus may include a first memory apparatus. The semiconductor memory apparatus may include a second memory apparatus. The first and second memory apparatuses may independently perform a write operation and a read operation in a first operation mode. The first memory apparatus may perform a write operation and a read operation. The second memory apparatus may perform a write operation with the first memory apparatus in a second operation mode. The second memory apparatus may perform a write operation and a read operation in replacement of the first memory apparatus in a third operation mode.

In an embodiment, a system may be provided. The system may include a semiconductor memory apparatus including first and second memory apparatuses. The system may include an external apparatus operable to access the semiconductor memory apparatus to perform data input/output operations. The semiconductor memory apparatus may perform data input/output operations with the external apparatus through the first memory apparatus in a first operation mode. The semiconductor memory apparatus may perform data input/output operations with the external apparatus through the first and second memory apparatuses in a second operation mode. The semiconductor memory apparatus may perform data input/output operations with the external apparatus through the second memory apparatus in a third operation mode.

In an embodiment, a semiconductor memory apparatus may be provided. The semiconductor memory apparatus may include a first memory apparatus. The semiconductor memory apparatus may include a second memory apparatus. The first memory apparatus may include a first command circuit which activates the first memory apparatus based on a command signal and a first chip select signal to allow the first memory apparatus to perform data input/output operations. The second memory apparatus may include a second command circuit which activates the second memory apparatus based on the command signal, the first chip select signal and a second chip select signal to allow the second memory apparatus to perform data input/output operations.

DETAILED DESCRIPTION

Hereinafter, a semiconductor memory apparatus capable of performing various operation modes, and a memory module and system including the same will be described below with reference to the accompanying drawings through various examples of embodiments.

Figure 1:
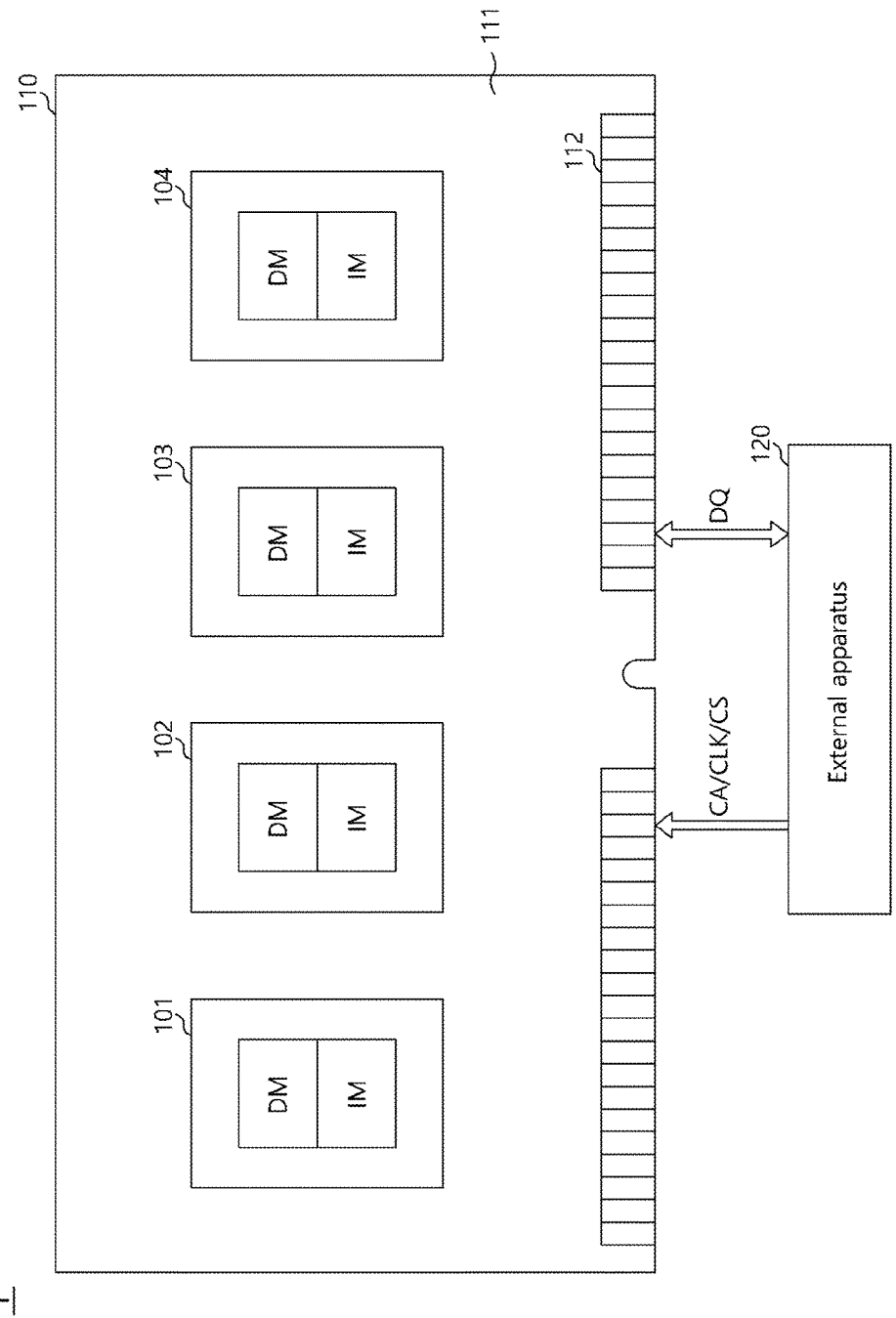
FIG. 1 is a diagram illustrating a representation of an example of the configuration of a system in accordance with an embodiment.

FIG. 1 is a diagram illustrating a representation of an example of the configuration of a system 1 in accordance with an embodiment. Referring to FIG. 1, the system 1 may include a memory module 110 and an external apparatus 120. The memory module 110 may perform data input and output (input/output) operations with the external apparatus 120. The memory module 110 may include at least one semiconductor memory apparatus for performing data input/output operations with the external apparatus 120. While it is illustrated in FIG. 1 that the memory module 110 includes four semiconductor memory apparatuses 101, 102, 103 and 104, it is not intended that the number of semiconductor memory apparatuses be limited. The semiconductor memory apparatuses 101, 102, 103 and 104 may be mounted to a module substrate 111, and may be electrically coupled with the external apparatus 120 through module pins 112 and signal lines (not illustrated) formed in the module substrate 111. Each of the semiconductor memory apparatuses 101, 102, 103 and 104 may communicate with the external apparatus 120 by forming an independent rank or channel, or at least two semiconductor memory apparatuses may communicate with the external apparatus 120 by forming one rank or channel.

The external apparatus 120 may perform data input/output operations by communicating with the memory module 110. The external apparatus 120 may perform data input/output operations by accessing the semiconductor memory apparatuses 101, 102, 103 and 104. The external apparatus 120 may be a host apparatus for controlling the memory module 110 and the semiconductor memory apparatuses 101, 102, 103 and 104. The host apparatus may include a central processing unit (CPU), a graphic processing unit (GPU), a multimedia processor (MMP), a digital signal processor (DSP) or a memory controller. Further, the host apparatus may be realized in the form of a system-on-chip by combining processor chips having various functions, such as application processors (AP). The external apparatus 120 may be test equipment. The external apparatus 120 may perform data input/output operations with the memory module 110 by providing various signals to the memory module 110. The external apparatus 120 may transmit a command signal CA, an address signal, a clock signal CLK, a chip select signal CS and data DQ to the memory module 110, and may receive data DQ outputted from the memory module 110. In an embodiment, a command signal and an address signal may be transmitted as one signal, and, in the present description, the one signal may be referred to as the command signal CA. The external apparatus 120 may be coupled with the memory module 110 through a plurality of buses. The external apparatus 120 may transmit the command signal CA, the clock signal CLK, the chip select signal CS and data DQ to the memory module 110 or receive data DQ from the memory module 110, through the plurality of buses. Buses through which the command signal CA, the clock signal CLK and the chip select signal CS are transmitted may be unidirectional communication buses, and buses through which data DQ is transmitted may be bidirectional communication buses.

Referring to FIG. 1, each of the semiconductor memory apparatuses 101, 102, 103 and 104 may include at least two memory apparatuses. Each of the memory apparatuses may include a volatile memory apparatus or a nonvolatile memory apparatus. The volatile memory apparatus may include an SRAM (static RAM), a DRAM (dynamic RAM) or an SDRAM (synchronous DRAM), and the nonvolatile memory apparatus may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM). Describing the semiconductor memory apparatus 101 representatively, the semiconductor memory apparatus 101 may include a first memory apparatus IM and a second memory apparatus DM. The first memory apparatus IM may be an independent memory apparatus, and the second memory apparatus DM may be a dependent memory apparatus. The semiconductor memory apparatus 101 may perform various operation modes. For example, the semiconductor memory apparatus 101 may perform a first operation mode, a second operation mode and a third operation mode. The first operation mode may be a normal operation mode. In the first operation mode, each of the first and second memory apparatuses IM and DM may independently perform data input/output operations. The external apparatus 120 may individually access the first and second memory apparatuses IM and DM in the first operation mode. The second operation mode may be a mirror mode. In the second operation mode, the first memory apparatus IM may independently perform data input/output operations, and the second memory apparatus DM may not independently perform data input/output operations and may perform the mirror operation of the first memory apparatus IM. The second memory apparatus DM may operate as the mirror memory apparatus of the first memory apparatus IM. The mirror operation is one for improving the operation reliability of the semiconductor memory apparatus 101. For example, the second memory apparatus DM may store data the same as the data stored in the first memory apparatus IM. The second memory apparatus DM may preliminarily store the same data in preparation for a case where an unexpected error occurs in the first memory apparatus IM and thus correct data is not stored. The third operation mode may be a spare mode. In the case where an error incapable of being repaired by redundancy means and ECC (error checking and correction) means occurs in the first memory apparatus IM, the semiconductor memory apparatus 101 may operate in the third operation mode. In the third operation mode, the second memory apparatus DM may operate as the spare memory apparatus of the first memory apparatus IM. In the third operation mode, the second memory apparatus DM may perform data input/output operations with the external apparatus 120 in place of the first memory apparatus IM.

A data input operation in which data is transmitted from the external apparatus 120 to the semiconductor memory apparatus 101 and is stored therein may be a write operation, and the data input operation and the write operation as having substantially the same meaning may be used in a mixed manner. A data output operation in which the data stored in the semiconductor memory apparatus 101 is transmitted to the external apparatus 120 may be a read operation, and the data output operation and the read operation as having substantially the same meaning may be used in a mixed manner. The external apparatus 120 may provide the chip select signal CS to access the semiconductor memory apparatus 101. The chip select signal CS as a signal capable of activating the memory apparatuses of the semiconductor memory apparatus 101 may be a signal which is provided from the external apparatus 120 to the semiconductor memory apparatus 101. In order to perform the write operation, the external apparatus 120 may provide the command signal CA and data DQ to the semiconductor memory apparatus 101. In order to perform the read operation, the external apparatus 120 may provide the command signal CA to the semiconductor memory apparatus 101 and may receive data DQ outputted from the semiconductor memory apparatus 101. The external apparatus 120 may provide the command signal CA including information related with various operation modes of the semiconductor memory apparatus 101 to set the various operation modes. The command signal CA may include information on the first to third operation modes. The semiconductor memory apparatus 101 may perform the normal mode when the command signal CA including the information on the first operation mode is received, may perform the mirror mode when the command signal CA including the information on the second operation mode is received, and may perform the spare mode when the command signal CA including the information on the third operation mode is received.

Figure 2:
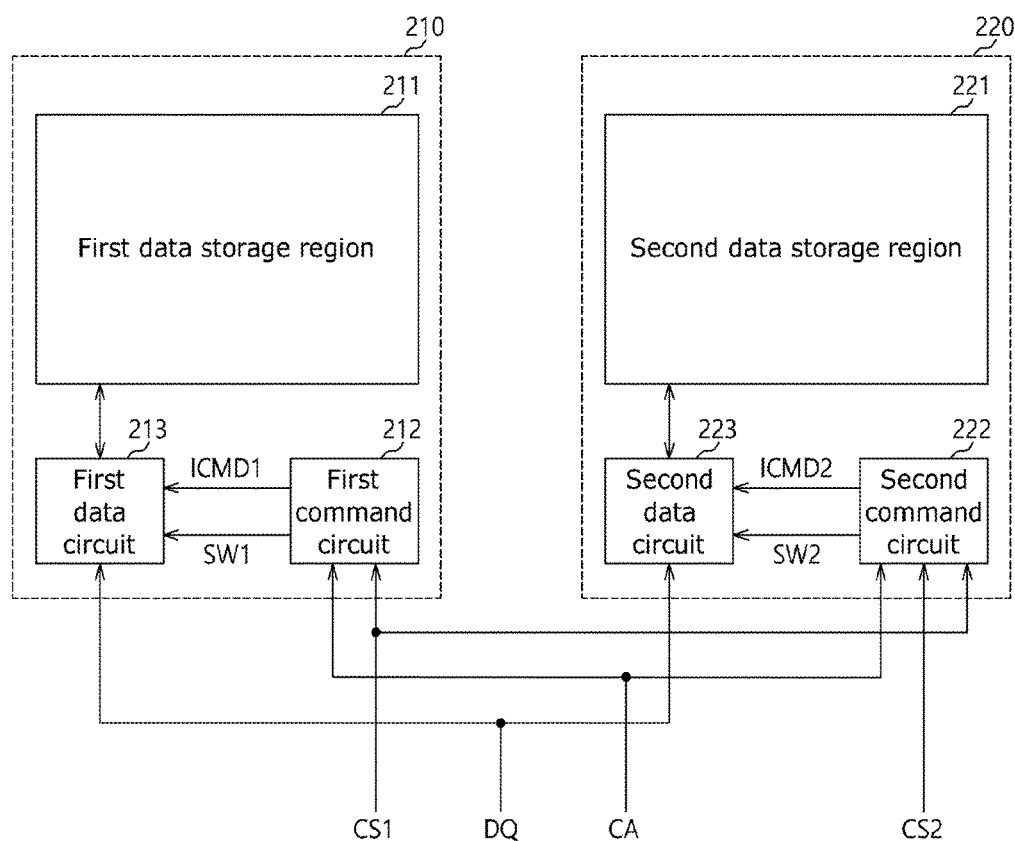
FIG. 2 is a diagram illustrating a representation of an example of the configuration of a semiconductor memory apparatus in accordance with an embodiment.

FIG. 2 is a diagram illustrating a representation of an example of the configuration of a semiconductor memory apparatus 200 in accordance with an embodiment. The semiconductor memory apparatus 200 may be applied as each of the semiconductor memory apparatuses 101, 102, 103 and 104 illustrated in FIG. 1. In FIG. 2, the semiconductor memory apparatus 200 may include a first memory apparatus 210 and a second memory apparatus 220. The first memory apparatus 210 may be applied as the first memory apparatus IM illustrated in FIG. 1, and the second memory apparatus 220 may be applied as the second memory apparatus DM illustrated in FIG. 1. The semiconductor memory apparatus 200 may perform data input/output operations through being accessed by the external apparatus 120 illustrated in FIG. 1. In order to perform data input/output operations, the semiconductor memory apparatus 200 may receive a command signal CA and a chip select signal CS from the external apparatus 120 and may receive data DQ from the external apparatus 120 or output data DQ to the external apparatus 120. The first and second memory apparatuses 210 and 220 may receive in common the command signal CA and data DQ.

The semiconductor memory apparatus 200 may operate in various operation modes. The semiconductor memory apparatus 200 may perform a first operation mode, a second operation mode and a third operation mode based on the command signal CA. The external apparatus 120 may provide a first chip select signal CS1 and a second chip select signal CS2 to the semiconductor memory apparatus 200. The first and second memory apparatuses 210 and 220 may form ranks or channels which are independent of each other. The first chip select signal CS1 may be a chip select signal which is provided by the external apparatus 120 to the semiconductor memory apparatus 200 to access a first rank or channel, and the second chip select signal CS2 may be a chip select signal which is provided by the external apparatus 120 to the semiconductor memory apparatus 200 to access a second rank or channel.

The semiconductor memory apparatus 200 may perform the first to third operation modes based on the command signal CA. In the first operation mode, the first memory apparatus 210 and the second memory apparatus 220 may configure ranks or channels independently of each other, and may independently perform a write operation and a read operation. The external apparatus 120 may provide the first chip select signal CS1 to perform data input/output operations with the first memory apparatus 210, and may provide the second chip select signal CS2 to perform data input/output operations with the second memory apparatus 220. In the second operation mode, the first memory apparatus 210 may perform a write operation and a read operation with the external apparatus 120, and the second memory apparatus 220 may perform a write operation with the external apparatus 120. In the second operation mode, the second memory apparatus 220 may not perform a read operation with the external apparatus 120. In the second operation mode, the external apparatus 120 may access only the first memory apparatus 210, and may provide only the first chip select signal CS1. In the second operation mode, the external apparatus 120 may not provide the second chip select signal CS2. In the second operation mode, the semiconductor memory apparatus 200 causes the second memory apparatus 220 to perform a write operation, with the first memory apparatus 210, even though the external apparatus 120 accesses only the first memory apparatus 210. In the third operation mode, the second memory apparatus 220 may perform a write operation and a read operation with the external apparatus 120. In the third operation mode, the second memory apparatus 220 may perform the write operation and the read operation in replacement of the first memory apparatus 210. In the third operation mode, the external apparatus 120 may access only the first memory apparatus 210, and may provide only the first chip select signal CS1. In the third operation mode, the external apparatus 120 may not provide the second chip select signal CS2. In the third operation mode, the semiconductor memory apparatus 200 causes the second memory apparatus 220 to perform a write operation and a read operation in place of the first memory apparatus 210, even though the external apparatus 120 accesses the first memory apparatus 210.

Referring to FIG. 2, the first memory apparatus 210 may include a first data storage region 211, a first command circuit 212 and a first data circuit 213. The second memory apparatus 220 may include a second data storage region 221, a second command circuit 222 and a second data circuit 223. The first and second data storage regions 211 and 221 may be a memory cell array which includes a plurality of memory cells. The first and second data storage regions 211 and 221 may store the data DQ transmitted from the external apparatus 120, in the memory cell array. The first and second command circuits 212 and 222 may respectively receive the command signal CA and allocated chip select signals CS1 and CS2. The first command circuit 212 may receive the command signal CA and the first chip select signal CS1. The second command circuit 222 may receive the command signal CA and the second chip select signal CS2. In an embodiment, the second command circuit 222 may further receive the first chip select signal CS1. The first command circuit 212 activates the first memory apparatus 210 based on the command signal CA and the first chip select signal CS1 such that the first memory apparatus 210 may perform data input/output operations. The first command circuit 212 may set any one operation mode among the first to third operation modes based on the command signal CA related with operation modes, and may generate an internal command signal ICMD1 based on the command signal CA and the first chip select signal CS1. The second command circuit 222 activates the second memory apparatus 220 based on the command signal CA, the first chip select signal CS1 and the second chip select signal CS2 such that the second memory apparatus 220 may perform data input/output operations. The second command circuit 222 may set any one operation mode among the first to third operation modes based on the command signal CA related with operation modes, and may generate an internal command signal ICMD2 based on the command signal CA, the first chip select signal CS1 and the second chip select signal CS2.

The first and second data circuits 213 and 223 may be coupled with the external apparatus 120, and may receive data DQ from the external apparatus 120 or output data DQ to the external apparatus 120. The first and second data circuits 213 and 223 may perform a write operation and a read operation based on the internal command signals ICMD1 and ICMD2, respectively. When the internal command signals ICMD1 and ICMD2 include information on a write operation, the first and second data circuits 213 and 223 may receive the data DQ transmitted from the external apparatus 120 and store the received data DQ in the respective first and second data storage regions 211 and 221. When the internal command signals ICMD1 and ICMD2 include information on a read operation, the first and second data circuits 213 and 223 may output the data stored in the first and second data storage regions 211 and 221, and may transmit the outputted data to the external apparatus 120.

The first command circuit 212 may generate a switching control signal SW1 based on the command signal CA, and the second command circuit 222 may generate a switching control signal SW2 based on the command signal CA. The switching control signal SW1 may be provided to the first data circuit 213 and control the write operation and read operation of the first data circuit 213. The switching control signal SW2 may be provided to the second data circuit 223 and control the write operation and read operation of the second data circuit 223. The switching control signals SW1 and SW2 and the operations of the data circuits 213 and 223 will be described later.

Figure 3A:
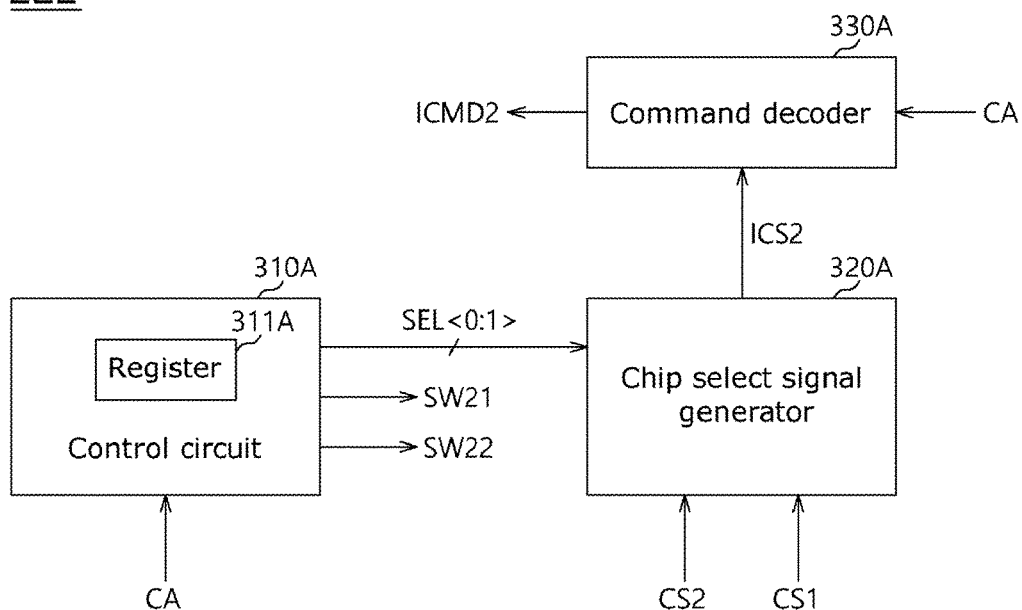
FIG. 3A is a diagram illustrating a representation of an example of the configuration of the second command circuit illustrated in FIG. 2.
Figure 3B:
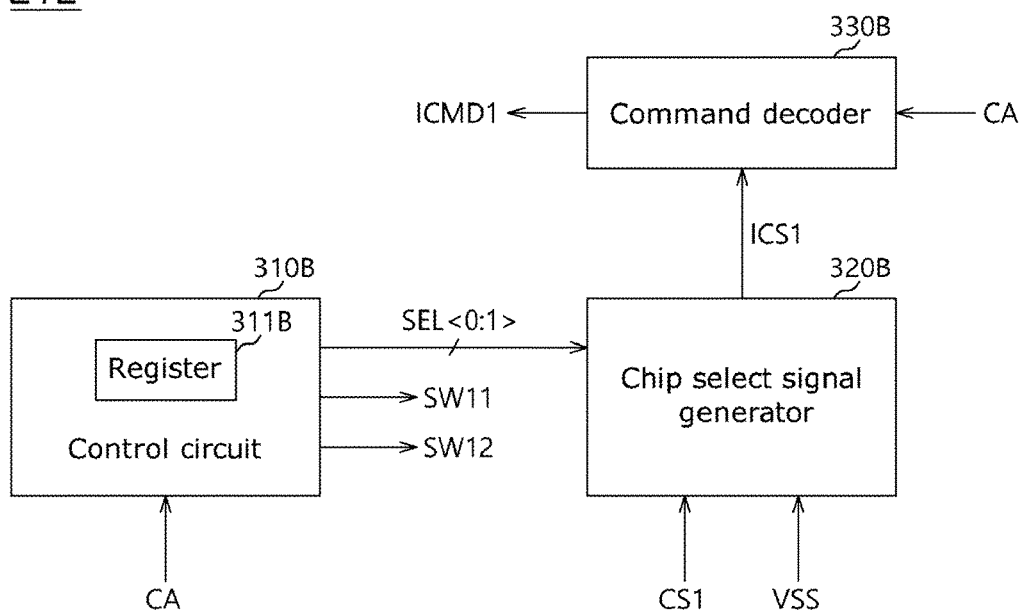
FIG. 3B is a diagram illustrating a representation of an example of the configuration of the first command circuit illustrated in FIG. 2.

FIG. 3A is a diagram illustrating a representation of an example of the configuration of the second command circuit 222 illustrated in FIG. 2, and FIG. 3B is a diagram illustrating a representation of an example of the configuration of the first command circuit 212 illustrated in FIG. 2. Referring to FIG. 3A, the second command circuit 222 may generate a second internal chip select signal ICS2 which activates the second memory apparatus 220, based on the command signal CA, the first chip select signal CS1 and the second chip select signal CS2. The second command circuit 222 may generate the second internal chip select signal ICS2 based on the command signal CA and the second chip select signal CS2 in the first operation mode. The second command circuit 222 may generate the second internal chip select signal ICS2 based on the command signal CA and the first chip select signal CS1 in the second operation mode. The second command circuit 222 may generate the second internal chip select signal ICS2 based on the command signal CA and the first chip select signal CS1 in the third operation mode. For example, the second command circuit 222 may enable the second internal chip select signal ICS2 based on the command signal CA and the first chip select signal CS1 in the second and third operation modes.

Referring to FIG. 3A, the second command circuit 222 may include a control circuit 310A, a chip select signal generator 320A and a command decoder 330A. The control circuit 310A may receive the command signal CA from the external apparatus 120. The command signal CA may be a command signal which includes information related with the first to third operation modes to set the operation mode of the semiconductor memory apparatus 200. The control circuit 310A may generate a chip select control signal SEL<0:1> based on the command signal CA. The control circuit 310A may include a register 311A. The register 311A may store the logic levels of the chip select control signal SEL<0:1> according to the first to third operation modes. For example, the register 311A may output the chip select control signal SEL<0:1> having different logic levels in the first to third operation modes, based on the command signal CA. The chip select control signal SEL<0:1> may include a plurality of bits, and the number of the bits of the chip select control signal SEL<0:1> may be changed depending on the number of memory apparatuses which are included in a semiconductor memory apparatus. For example, in the case where the semiconductor memory apparatus includes two memory apparatuses, a chip select control signal may be a 2-bit signal. In the case where the semiconductor memory apparatus includes at least three memory apparatuses, the number of the bits of a chip select control signal may be at least 3.

The chip select signal generator 320A may receive the chip select control signal SEL<0:1>, the first chip select signal CS1 and the second chip select signal CS2. The chip select signal generator 320A may generate the second internal chip select signal ICS2 based on the chip select control signal SEL<0:1>, the first chip select signal CS1 and the second chip select signal CS2. The chip select signal generator 320A may generate the second internal chip select signal ICS2 from the second chip select signal CS2 based on the chip select control signal SEL<0:1> in the first operation mode. The chip select signal generator 320A may generate the second internal chip select signal ICS2 from the first chip select signal CS1 based on the chip select control signal SEL<0:1> in the second operation mode. The chip select signal generator 320A may generate the second internal chip select signal ICS2 from the first chip select signal CS1 based on the chip select control signal SEL<0:1> in the third operation mode.

The control circuit 310A may further generate first and second switch control signals SW21 and SW22 based on the command signal CA. The first and second switch control signals SW21 and SW22 may control the second data circuit 223, and detailed descriptions thereof will be made later. The register 311A may store the logic levels of the first and second switch control signals SW21 and SW22 according to operation modes. The register 311A may output the first and second switch control signals SW21 and SW22 having different logic levels according to the first to third operation modes, based on the command signal CA.

The command decoder 330A may receive the second internal chip select signal ICS2 and the command signal CA. The command signal CA may include information related with various operations that the semiconductor memory apparatus 200 may perform. For example, the command signal CA may include information related with not only the write operation and read operation but also the active operation, the precharge operation and the refresh operation of the semiconductor memory apparatus 200. The command decoder 330A may decode the command signal CA and generate the internal command signal ICMD2, when the second internal chip select signal ICS2 is enabled.

Referring to FIG. 3B, the first command circuit 212 may generate a first internal chip select signal ICS1 which activates the first memory apparatus 210, based on the command signal CA and the first chip select signal CS1. The first command circuit 212 may generate the first internal chip select signal ICS1 based on the command signal CA and the first chip select signal CS1 in the first operation mode. The first command circuit 212 may generate the first internal chip select signal ICS1 based on the command signal CA and the first chip select signal CS1 in the second operation mode. The first command circuit 212 may not generate the first internal chip select signal ICS1 based on the command signal CA in the third operation mode. The first command circuit 212 may disable the first internal chip select signal ICS1 even if the first chip select signal CS1 is enabled, in the third operation mode.

Referring to FIG. 3B, the first command circuit 212 may include a control circuit 310B, a chip select signal generator 320B and a command decoder 330B. The control circuit 310B may receive the command signal CA from the external apparatus 120. The command signal CA may be a command signal which includes information related with the first to third operation modes to set the operation mode of the semiconductor memory apparatus 200. The control circuit 310B may generate the chip select control signal SEL<0:1> based on the command signal CA. The control circuit 310B may include a register 311B. The register 311B may store the logic levels of the chip select control signal SEL<0:1> according to the first to third operation modes. For example, the register 311B may output the chip select control signal SEL<0:1> having different logic levels in the first to third operation modes, based on the command signal CA.

The chip select signal generator 320B may receive the chip select control signal SEL<0:1> and the first chip select signal CS1. The chip select signal generator 320B may generate the first internal chip select signal ICS1 based on the chip select control signal SEL<0:1> and the first chip select signal CS1. Because the chip select signal generator 320B may be manufactured to have the same structure as the chip select signal generator 320A illustrated in FIG. 3A, the chip select signal generator 320B may additionally receive a predetermined voltage VSS to correspond to that the chip select signal generator 320A receives the first chip select signal CS1. The predetermined voltage VSS may have a voltage level corresponding to a logic level when the first internal chip select signal ICS1 is in a disabled state, and may be, for example, a ground voltage. The chip select signal generator 320B may generate the first internal chip select signal ICS1 from the first chip select signal CS1 based on the chip select control signal SEL<0:1> in the first operation mode. The chip select signal generator 320B may generate the first internal chip select signal ICS1 from the first chip select signal CS1 based on the chip select control signal SEL<0:1> in the second operation mode. The chip select signal generator 320B may generate the first internal chip select signal ICS1 from the predetermined voltage VSS based on the chip select control signal SEL<0:1> in the third operation mode.

The control circuit 310B may further generate first and second switch control signals SW11 and SW12 based on the command signal CA. The first and second switch control signals SW11 and SW12 may control the first data circuit 213, and descriptions thereof will be made later. The register 311B may store the logic levels of the first and second switch control signals SW11 and SW12 according to the operation modes. The register 311B may output the first and second switch control signals SW11 and SW12 having different logic levels according to the first to third operation modes, based on the command signal CA.

The command decoder 330B may receive the first internal chip select signal ICS1 and the command signal CA. The command signal CA may include information related with various operations that the semiconductor memory apparatus 200 may perform. The command decoder 330B may decode the command signal CA and generate the internal command signal ICMD1, when the first internal chip select signal ICS1 is enabled.

Figure 4A:
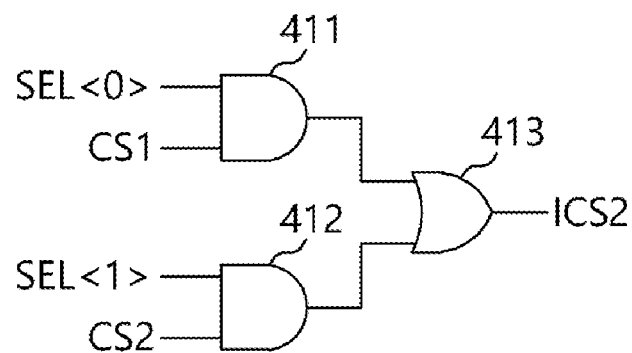
FIG. 4A is a diagram illustrating a representation of an example of the configuration of the chip select signal generator illustrated in FIG. 3A.
Figure 4B:
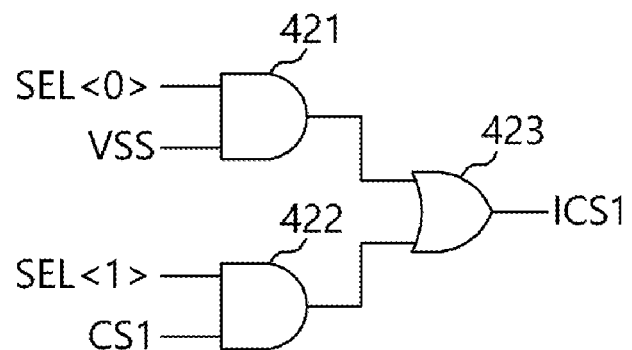
FIG. 4B is a diagram illustrating a representation of an example of the configuration of the chip select signal generator illustrated in FIG. 3B.

FIG. 4A is a diagram illustrating a representation of an example of the configuration of the chip select signal generator 320A of the second command circuit 222 illustrated in FIG. 3A, and FIG. 4B is a diagram illustrating a representation of an example of the configuration of the chip select signal generator 320B of the first command circuit 212 illustrated in FIG. 3B. Referring to FIG. 4A, the chip select signal generator 320A may include logic operators to perform logic operations. For example, the chip select signal generator 320A may include AND operators and an OR operator. In an embodiment, for example, the chip select signal generator 320A may include a first AND gate 411, a second AND gate 412, and an OR gate 413. However, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations. Referring again to FIG. 4A, the first AND gate 411 may receive the first bit SEL<0> of the chip select control signal SEL<0:1> and the first chip select signal CS1. The second AND gate 412 may receive the second bit SEL<1> of the chip select control signal SEL<0:1> and the second chip select signal CS2. The OR gate 413 may receive the outputs of the first and second AND gates 411 and 412 and generate the second internal chip select signal ICS2. Therefore, the chip select signal generator 320A may generate the second internal chip select signal ICS2 from the first and second chip select signals CS1 and CS2 based on the level of the chip select control signal SEL<0:1>. Referring to FIG. 4B, the chip select signal generator 320B may include logic operators to perform logic operations. For example, the chip select signal generator 320B may include AND operators and an OR operator. In an embodiment, for example, the chip select signal generator 320B may include a first AND gate 421, a second AND gate 422, and an OR gate 423. However, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations. Referring again to FIG. 4B, the first AND gate 421 may receive the first bit SEL<0> of the chip select control signal SEL<0:1> and the predetermined voltage VSS. The second AND gate 422 may receive the second bit SEL<1> of the chip select control signal SEL<0:1> and the first chip select signal CS1. The OR gate 423 may receive the outputs of the first and second AND gates 421 and 422 and generate the first internal chip select signal ICS1. Therefore, the chip select signal generator 320B may generate the first internal chip select signal ICS1 from the first chip select signal CS1 and the predetermined voltage VSS based on the level of the chip select control signal SEL<0:1>.

Figure 5A:
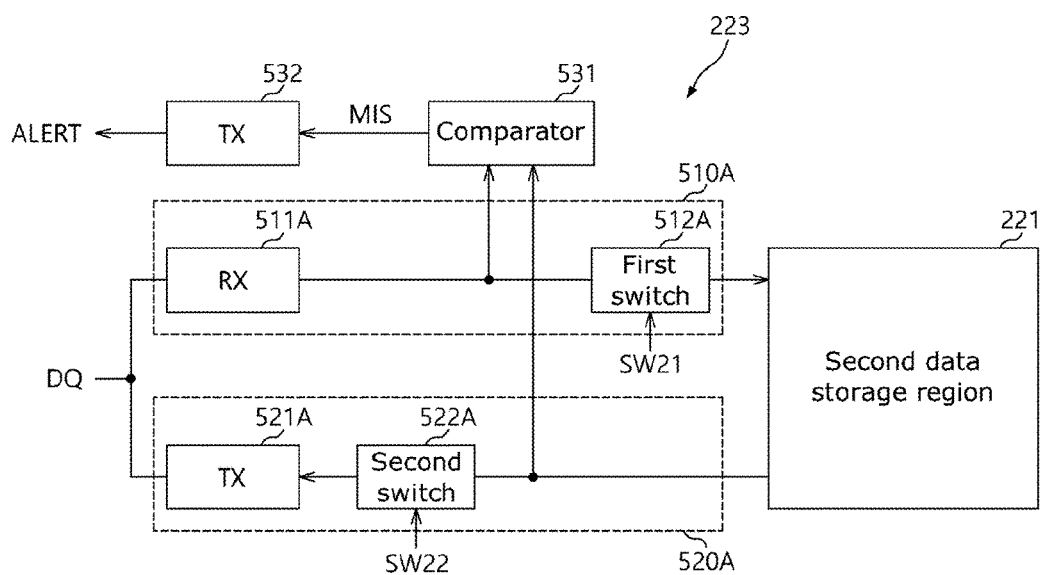
FIG. 5A is a diagram illustrating a representation of an example of the configuration of the second data circuit illustrated in FIG. 2.
Figure 5B:
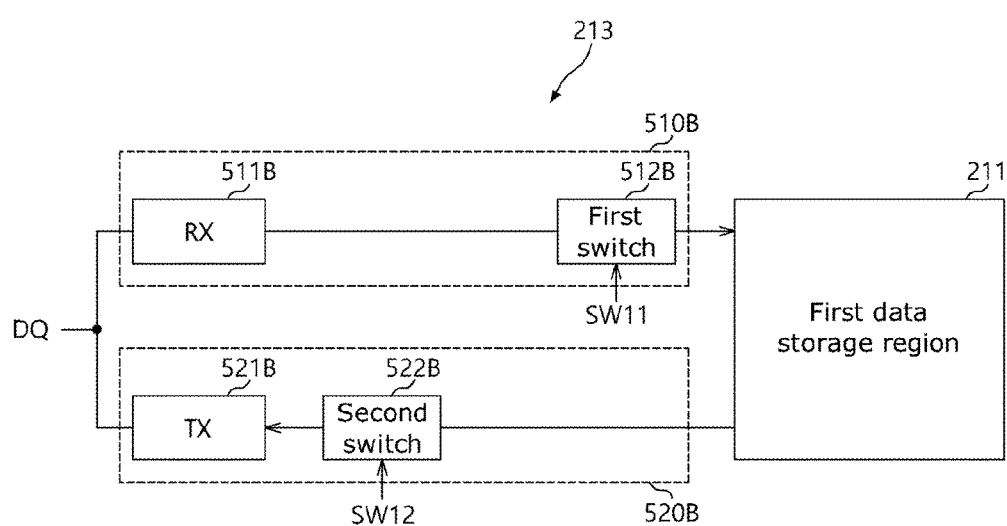
FIG. 5B is a diagram illustrating a representation of an example of the configuration of the first data circuit illustrated in FIG. 2.

FIG. 5A is a diagram illustrating a representation of an example of the configurations of the second data circuit 223 and the second data storage region 221 illustrated in FIG. 2, and FIG. 5B is a diagram illustrating a representation of an example of the configurations of the first data circuit 213 and the first data storage region 211 illustrated in FIG. 2. Referring to FIG. 5A, the second data circuit 223 may include a data input path 510A and a data output path 520A. The data input path 510A as a path for performing the write operation of the second memory apparatus 220 may include a data receiver (RX) 511A and a first switch 512A. The data output path 520A as a path for performing the read operation of the second memory apparatus 220 may include a data transmitter (TX) 521A and a second switch 522A. The data receiver 511A may be coupled with the external apparatus 120 and receive the data DQ transmitted from the external apparatus 120. The data receiver 511A may provide received data to the second data storage region 221 and store the received data in the second data storage region 221. The data transmitter 521A may be coupled with the external apparatus 120 and transmit data DQ to the external apparatus 120. The data transmitter 521A may transmit the data outputted from the second data storage region 221, to the external apparatus 120. The first switch 512A may block the data input path 510A depending on an operation mode. The first switch 512A may be turned on based on the first switch control signal SW21. The first switch 512A may be turned on and activate the data input path 510A when the first switch control signal SW21 is in an enabled state. Thus, the second memory apparatus 220 may perform a data input operation and/or a write operation. The first switch 512A may be turned off and block the data input path 510A when the first switch control signal SW21 is in a disabled state. Thus, the second memory apparatus 220 may not perform the data input operation and/or the write operation. The second switch 522A may block the data output path 520A depending on an operation mode. The second switch 522A may be turned on based on the second switch control signal SW22. The second switch 522A may be turned on and activate the data output path 520A when the second switch control signal SW22 is in an enabled state. Thus, the second memory apparatus 220 may perform a data output operation and/or a read operation. The second switch 522A may be turned off and block the data output path 520A when the second switch control signal SW22 is in a disabled state. Thus, the second memory apparatus 220 may not perform the data output operation and/or the read operation.

The second data circuit 223 may further include a comparator 531 and an alert transmitter (TX) 532. The comparator 531 and the alert transmitter 532 may detect whether an error has occurred in the semiconductor memory apparatus 200, and may transmit detected information to the external apparatus 120. The comparator 531 may compare data on the data input path 510A and data on the data output path 520A, and may generate a detection signal MIS when the data on the data input path 510A and the data on the data output path 520A are different from each other. The alert transmitter 532 may output the detection signal MIS as an alert signal ALERT. The alert signal ALERT may be transmitted to the external apparatus 120. When the semiconductor memory apparatus 200 operates in the second operation mode, each of the first and second memory apparatuses 210 and 220 may store the data DQ transmitted from the external apparatus 120. The semiconductor memory apparatus 200 may compare the data stored in the first memory apparatus 210 and the data stored in the second memory apparatus 220 to verify reliability. The data stored in the first memory apparatus 210 may be transmitted to the second memory apparatus 220 and be inputted to the data input path 510A through the data receiver 511A, and the data outputted from the second data storage region 221 of the second memory apparatus 220 may exist on the data output path 520A. In the case where the data on the data input path 510A and the data on the data output path 520A are the same with each other, it may be determined that an error has not occurred. In the case where the data on the data input path 510A and the data on the data output path 520A are different from each other, it may be determined that an error has occurred and the comparator 531 may generate the detection signal MIS. The alert transmitter 532 may transmit the alert signal ALERT to the external apparatus 120, and the external apparatus 120 may recognize that a reliability problem of the semiconductor memory apparatus 200 has occurred.

Referring to FIG. 5B, the first data circuit 213 may have substantially the same configuration as the second data circuit 223 illustrated in FIG. 5A. The first data circuit 213 may include a data input path 510B which includes a data receiver (RX) 511B and a first switch 512B and a data output path 520B which includes a data transmitter (TX) 521B and a second switch 522B. The first switch 512B may be turned on based on the first switch control signal SW11. The first switch 512B may activate or block the data input path 510B. The second switch 522B may be turned on based on the second switch control signal SW12. The second switch 522B may activate or block the data output path 520B. The first data circuit 213 may not include components corresponding to the comparator 531 and the alert transmitter 532, unlike the second data circuit 223. In a semiconductor process, in the case where the first and second data circuits 213 and 223 are manufactured to have the same structure, the default states of a comparator and an alert transmitter which may be included in the first data circuit 213 may be deactivated states.

The following table represents the logic levels of the chip select control signal SEL<0:1> and the logic levels of the internal chip select signals ICS1 and ICS2 and the switch control signals SW11, SW12, SW21 and SW22 according to the operation modes to be performed by the semiconductor memory apparatus 200. Operations of the semiconductor memory apparatus 200 and the system 1 in accordance with the embodiments will be described below with reference to the following table and FIGS. 1 to 5B. Further, the logic levels of the signals may be different from or the opposite of those described. For example, a signal described as having a logic "high" (i.e., H) level may alternatively have a logic "low" (i.e., L) level, and a signal described as having a logic "low" level may alternatively have a logic "high" level.

|  | 1st operation mode (Normal mode) | 2nd operation mode (Mirror mode) | 3rd operation mode (Spare mode) |
| --- | --- | --- | --- |
| SEL<0> | L | H | H |
| SEL<1> | H | H | L |
| ICS1 | From CS1 | From CS1 | L |
| ICS2 | From CS2 | From CS1 | From CS1 |
| SW11 | H | H | L |
| SW12 | H | H | L |
| SW21 | H | H | H |
| SW22 | H | L | H |

First Operation Mode (Normal Mode)

The semiconductor memory apparatus 200 may perform the first operation mode by receiving the command signal CA related with the first operation mode, from the external apparatus 120. In the first operation mode as the normal mode, each of the first and second memory apparatuses 210 and 220 may independently perform data input/output operations. Based on the command signal CA related with the first operation mode, the control circuits 310B and 310A of the first and second command circuits 212 and 222 may output the first bit SEL<0> of the chip select control signal SEL<0:1> at a logic low level and output the second bit SEL<1> of the chip select control signal SEL<0:1> at a logic high level. Therefore, the chip select signal generator 320B of the first command circuit 212 may generate the first internal chip select signal ICS1 from the first chip select signal CS1 based on the chip select control signal SEL<0:1>. The chip select signal generator 320A of the second command circuit 222 may generate the second internal chip select signal ICS2 from the second chip select signal CS2 based on the chip select control signal SEL<0:1>. The control circuit 310B of the first command circuit 212 may output the first switch control signal SW11 and the second switch control signal SW12 at a logic high level. The control circuit 310A of the second command circuit 222 may output the first switch control signal SW21 and the second switch control signal SW22 at a logic high level. Thus, the data input path 510B and the data output path 520B of the first data circuit 213 may be activated, and the data input path 510A and the data output path 520A of the second data circuit 223 may be activated. Thus, the first and second memory apparatuses 210 and 220 may be in a state in which they may perform data input/output operations independently of each other. The external apparatus 120 may provide the enabled first chip select signal CS1 to access the first memory apparatus 210, and provide the enabled second chip select signal CS2 to access the second memory apparatus 220.

Second Operation Mode (Mirror Mode)

The semiconductor memory apparatus 200 may perform the second operation mode by receiving the command signal CA related with the second operation mode, from the external apparatus 120. In the second operation mode as the mirror mode, the first memory apparatus 210 may perform data input/output operations, but the second memory apparatus 220 may not independently perform data input/output operations. In the second operation mode, the second memory apparatus 220 may perform a data input operation of storing data the same as the data stored in the first memory apparatus 210, and may not perform a data output operation. Based on the command signal CA related with the second operation mode, the control circuits 310B and 310A of the first and second command circuits 212 and 222 may output the first bit SEL<0> of the chip select control signal SEL<0:1> at the logic high level and output the second bit SEL<1> of the chip select control signal SEL<0:1> at the logic high level. While the registers 311B and 311A retain the logic levels of the chip select control signal SEL<0:1> in the first operation mode, when the command signal CA related with the second operation mode is received, the registers 311B and 311A may trigger the logic levels of the chip select control signal SEL<0:1> to the logic high level. Therefore, the chip select signal generator 320B of the first command circuit 212 may generate the first internal chip select signal ICS1 from the first chip select signal CS1 based on the chip select control signal SEL<0:1>. The chip select signal generator 320A of the second command circuit 222 may generate the second internal chip select signal ICS2 from the first chip select signal CS1 based on the chip select control signal SEL<0:1>.

The control circuit 310B of the first command circuit 212 may output the first switch control signal SW11 and the second switch control signal SW12 at the logic high level. The control circuit 310A of the second command circuit 222 may output the first switch control signal SW21 at the logic high level and output the second switch control signal SW22 at a logic low level. Accordingly, the data input path 510B and the data output path 520B of the first data circuit 213 may be activated. The data input path 510A of the second data circuit 223 may be activated, but the data output path 520A of the second data circuit 223 may be blocked. If the external apparatus 120 provides the enabled first chip select signal CS1 to access the first memory apparatus 210, both the first and second internal chip select signals ICS1 and ICS2 may be enabled. When the external apparatus 120 provides the command signal CA related with a write operation and data DQ to perform a data input operation, the data DQ transmitted from the external apparatus 120 may be provided simultaneously to the data input paths 510B and 510A of the first and second memory apparatuses 210 and 220, and the first and second memory apparatuses 210 and 220 may store together the data DQ. The semiconductor memory apparatus 200 may output the data stored in the first memory apparatus 210 to the second memory apparatus 220, and the comparator 531 of the second memory apparatus 220 may compare the data outputted from the first data storage region 211 of the first memory apparatus 210 and the data outputted from the second data storage region 221 of the second memory apparatus 220 and generate the detection signal MIS. When the data outputted from the first memory apparatus 210 and the data stored in the second memory apparatus 220 are different from each other, the comparator 531 may generate the detection signal MIS, and the alert transmitter 532 may transmit the detection signal MIS to the external apparatus 120 as the alert signal ALERT.

Third Operation Mode (Spare Mode)

The semiconductor memory apparatus 200 may perform the third operation mode by receiving the command signal CA related with the third operation mode, from the external apparatus 120. In the third operation mode as the spare mode, the second memory apparatus 220 may perform data input/output operations in replacement of the first memory apparatus 210. When a serious error incapable of being repaired by redundancy means and ECC means has occurred in the first memory apparatus 210, the semiconductor memory apparatus 200 may perform the third operation mode. In the third operation mode, the second memory apparatus 220 may perform data input/output operations in replacement of the first memory apparatus 210. In the third operation mode, since the semiconductor memory apparatus 200 performs the spare operation of a memory apparatus regardless of the external apparatus 120, the external apparatus 120 does not need to recognize whether an error has occurred in the first memory apparatus 210 in the semiconductor memory apparatus 200, and it is sufficient for the external apparatus 120 to access the first memory apparatus 210 regardless of whether an error has occurred.

Based on the command signal CA related with the third operation mode, the control circuits 310B and 310A of the first and second command circuits 212 and 222 may output the first bit SEL<0> of the chip select control signal SEL<0:1> at the logic high level and output the second bit SEL<1> of the chip select control signal SEL<0:1> at the logic low level. While the registers 311B and 311A retain the logic levels of the chip select control signal SEL<0:1> in the first operation mode or the second operation mode, when the command signal CA related with the third operation mode is received, the registers 311B and 311A may trigger the logic levels of the chip select control signal SEL<0:1> to the logic high level and the logic low level. Accordingly, the chip select signal generator 320B of the first command circuit 212 may generate the first internal chip select signal ICS1 which is disabled to a logic low level. The chip select signal generator 320A of the second command circuit 222 may generate the second internal chip select signal ICS2 from the first chip select signal CS1 based on the chip select control signal SEL<0:1>.

The control circuit 310B of the first command circuit 212 may output the first switch control signal SW11 and the second switch control signal SW12 at a logic low level. The control circuit 310A of the second command circuit 222 may output the first switch control signal SW21 and the second switch control signal SW22 at the logic high level. Accordingly, the data input path 510B and the data output path 520B of the first data circuit 213 may be blocked. The data input path 510A and the data output path 520A of the second data circuit 223 may be activated. When the external apparatus 120 provides the enabled first chip select signal CS1 to access the first memory apparatus 210, the first internal chip select signals ICS1 may retain a disabled state, and the second internal chip select signal ICS2 may be enabled. Accordingly, the second memory apparatus 220 may perform data input/output operations with the external apparatus 120 in replacement of the first memory apparatus 210.

While various embodiments have been described above, it will be understood to those skilled in the art that the embodiments described are examples only. Accordingly, the semiconductor memory apparatus capable of performing various operation modes, and the memory module and system including the same described herein should not be limited based on the described embodiments.

What is claimed is:

1. A semiconductor memory apparatus comprising:
a first memory apparatus; and
a second memory apparatus,
wherein the first and second memory apparatuses independently perform a write operation and a read operation in a first operation mode, the first memory apparatus performs a write operation and a read operation and the second memory apparatus performs a write operation with the first memory apparatus in a second operation mode, and the second memory apparatus performs a write operation and a read operation in replacement of the first memory apparatus in a third operation mode.

2. The semiconductor memory apparatus according to claim 1,
wherein the first memory apparatus includes a first command circuit which generates a first internal chip select signal based on a command signal and a first chip select signal and generates an internal command signal based on the command signal when the first internal chip select signal is enabled, and
wherein the first command circuit generates the first internal chip select signal based on the first chip select signal in the first and second operation modes, and disables the first internal chip select signal in the third operation mode.

3. The semiconductor memory apparatus according to claim 2, wherein the first command circuit is configured to disable the first internal chip select signal even if the first chip select signal is enabled while in the third operation mode.

4. The semiconductor memory apparatus according to claim 2, wherein the first command circuit comprises:
a control circuit configured to generate a chip select control signal based on the command signal;
a first chip select signal generator configured to generate the first internal chip select signal from the first chip select signal and a predetermined voltage based on the chip select control signal; and
a command decoder configured to generate the internal command signal based on the first internal chip select signal and the command signal.

5. The semiconductor memory apparatus according to claim 2, wherein the first memory apparatus comprises:
a data input path configured to perform a data input operation by receiving data externally from the first memory apparatus;
a first switch configured to activate the data input path based on a first switch control signal;
a data output path configured to perform a data output operation by outputting data stored in a data storage region; and
a second switch configured to activate the data output path based on a second switch control signal.

6. The semiconductor memory apparatus according to claim 5, wherein the first and second switches are turned on in the first and second operation modes, and are turned off in the third operation mode.

7. The semiconductor memory apparatus according to claim 5, wherein the control circuit additionally generates the first and second switch control signals based on the command signal.

8. The semiconductor memory apparatus according to claim 1,
wherein the second memory apparatus includes a second command circuit which generates a second internal chip select signal based on the command signal, the first chip select signal and a second chip select signal, and generates an internal command signal based on the command signal when the second internal chip select signal is enabled, and
wherein the second command circuit generates the second internal chip select signal based on the second chip select signal in the first operation mode, and generates the second internal chip select signal based on the first chip select signal in the second and third operation modes.

9. The semiconductor memory apparatus according to claim 8, wherein the second command circuit comprises:
a control circuit configured to generate a chip select control signal based on the command signal;
a second chip select signal generator configured to generate the second internal chip select signal from the first chip select signal and the second chip select signal based on the chip select control signal; and
a command decoder configured to generate the internal command signal based on the second internal chip select signal and the command signal.

10. The semiconductor memory apparatus according to claim 9, wherein the second memory apparatus comprises:
a data input path configured to perform a data input operation by receiving data externally from the second memory apparatus;
a first switch configured to activate the data input path based on a first switch control signal;
a data output path configured to perform a data output operation by outputting data stored in a data storage region; and
a second switch configured to activate the data output path based on a second switch control signal.

11. The semiconductor memory apparatus according to claim 10, wherein the first and second switches are turned on in the first operation mode, the first switch is turned on and the second switch is turned off in the second operation mode, and the first and second switches are turned on in the third operation mode.

12. The semiconductor memory apparatus according to claim 9, wherein the control circuit additionally generates the first and second switch control signals based on the command signal.

13. The semiconductor memory apparatus according to claim 1, wherein the second memory apparatus stores the same data stored in the first memory apparatus when the second memory apparatus performs the write operation with the first semiconductor apparatus in the second operation mode.

14. The semiconductor memory apparatus according to claim 1, wherein the second memory apparatus does not perform the read operation in the second operation mode.

15. A system comprising:
a semiconductor memory apparatus including first and second memory apparatuses; and
an external apparatus operable to access the semiconductor memory apparatus to perform data input and output (input/output) operations, wherein the semiconductor memory apparatus performs data input/output operations with the external apparatus through the first memory apparatus and the second memory apparatus in a first operation mode and a second operation mode, and performs data input/output operations with the external apparatus through the second memory apparatus in a third operation mode.

16. The system according to claim 15, wherein the external apparatus provides a command signal related with the first to third operation modes and a chip select signal for accessing the semiconductor memory apparatus, to the semiconductor memory apparatus.

17. The system according to claim 15, wherein the external apparatus provides a first chip select signal and a second chip select signal in the first operation mode, and provides only the first chip select signal in the second and third operation modes.

18. The system according to claim 15,
wherein the first memory apparatus generates a first internal chip select signal by receiving the command signal and the first chip select signal from the external apparatus, and
wherein the first memory apparatus generates the first internal chip select signal based on the first chip select signal in the first and second operation modes, and disables the first internal chip select signal in the third operation mode.

19. The system according to claim 18, wherein the first memory apparatus activates a data input path and a data output path in the first and second operation modes, and blocks the data input path and the data output path in the third operation mode.

20. The system according to claim 18,
wherein the second memory apparatus generates a second internal chip select signal by receiving the command signal, the first chip select signal and the second chip select signal from the external apparatus, and
wherein the second memory apparatus generates the second internal chip select signal based on the second chip select signal in the first operation mode, and generates the second internal chip select signal based on the first chip select signal in the second and third operation modes.

21. The system according to claim 20, wherein the second memory apparatus activates a data input path and a data output path in the first and third operation modes, and activates the data input path and blocks the data output path in the second operation mode.

22. A semiconductor memory apparatus comprising:
a first memory apparatus; and
a second memory apparatus,
wherein the first memory apparatus includes a first command circuit which activates the first memory apparatus based on a command signal and a first chip select signal to allow the first memory apparatus to perform data input and output (input/output) operations, and
wherein the second memory apparatus includes a second command circuit which activates the second memory apparatus based on the command signal, the first chip select signal and a second chip select signal to allow the second memory apparatus to perform data input/output operations.

23. The semiconductor memory apparatus according to claim 22, wherein, in a first operation mode, the first command circuit generates a first internal chip select signal for activating the first memory apparatus, based on the command signal and the first chip select signal, and the second command circuit generates a second internal chip select signal for activating the second memory apparatus, based on the command signal and the second chip select signal.

24. The semiconductor memory apparatus according to claim 22, wherein, in a second operation mode, the first command circuit generates a first internal chip select signal for activating the first memory apparatus, based on the command signal and the first chip select signal, and the second command circuit generates a second internal chip select signal for activating the second memory apparatus, based on the command signal and the first chip select signal.

25. The semiconductor memory apparatus according to claim 22, wherein, in a third operation mode, the first command circuit disables a first internal chip select signal for activating the first memory apparatus, based on the command signal, and the second command circuit generates a second internal chip select signal for activating the second memory apparatus, based on the command signal and the first chip select signal.

26. The semiconductor memory apparatus according to claim 22, wherein the first command circuit comprises:
a control circuit configured to generate a chip select control signal based on the command signal;
a first chip select signal generator configured to generate the first internal chip select signal from the first chip select signal and a predetermined voltage based on the chip select control signal; and
a command decoder configured to generate an internal command signal based on the first internal chip select signal and the command signal.

27. The semiconductor memory apparatus according to claim 26,
wherein the first memory apparatus further includes a first data circuit which includes a data input path and a data output path and performs data input/output operations through the data input path and the data output path when the first internal chip select signal is enabled, and
wherein the first command circuit activates the data input path and the data output path in the first operation mode and the second operation mode, and blocks the data input path and the data output path in the third operation mode.

28. The semiconductor memory apparatus according to claim 22, wherein the second command circuit comprises:
a control circuit configured to generate a chip select control signal based on the command signal;
a second chip select signal generator configured to generate the second internal chip select signal from the first chip select signal and the second chip select signal based on the chip select control signal; and
a command decoder configured to generate an internal command signal based on the second internal chip select signal and the command signal.

29. The semiconductor memory apparatus according to claim 28,
wherein the second memory apparatus further includes a second data circuit which includes a data input path and a data output path and performs data input/output operations through the data input path and the data output path when the second internal chip select signal is enabled, and
wherein the second command circuit activates the data input path and the data output path in the first operation mode and the third operation mode, and activates the data input path and blocks the data output path in the second operation mode.

\* \* \* \* \*